(12) United States Patent
Jang et al.

(10) Patent No.: US 10,862,394 B2
(45) Date of Patent: Dec. 8, 2020

(54) SYSTEM AND METHOD FOR IMPROVING RESOLUTION OF VOLTAGE COMMAND OF LOW VOLTAGE DC-DC CONVERTER

(71) Applicants: Hyundai Motor Company, Seoul (KR); Kia Motors Corporation, Seoul (KR)

(72) Inventors: Hui Sung Jang, Gyeonggi-do (KR); Dong Gyun Woo, Gyeonggi-do (KR); Hyun Wook Seong, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/658,291

(22) Filed: Oct. 21, 2019

(65) Prior Publication Data

US 2020/0336064 A1 Oct. 22, 2020

(30) Foreign Application Priority Data

Apr. 22, 2019 (KR) .......................... 10-2019-0046649

(51) Int. Cl.
*H02M 3/156* (2006.01)
*H02M 1/084* (2006.01)
*H03M 5/08* (2006.01)
*H02M 1/00* (2006.01)

(52) U.S. Cl.
CPC ........... *H02M 3/156* (2013.01); *H02M 1/084* (2013.01); *H03M 5/08* (2013.01); *H02M 2001/007* (2013.01); *H02M 2001/008* (2013.01); *H02M 2001/0012* (2013.01)

(58) Field of Classification Search
CPC ................. H02M 3/156; H02M 1/084; H02M 2001/008; H02M 2001/0012; H02M 2001/007; H02M 1/00; H03M 5/08
See application file for complete search history.

(56) References Cited

U.S. PATENT DOCUMENTS 10,224,805 B1 * 3/2019 Young ..................... H02M 1/32
10,333,402 B2 * 6/2019 Buthker ................ H02M 3/156

FOREIGN PATENT DOCUMENTS

| JP | 2016066861 A | 4/2016 |
| KR | 10-1513487 | 4/2015 |
| KR | 101779698 B1 | 9/2017 |
| KR | 101875864 B1 | 8/2018 |

* cited by examiner

*Primary Examiner* — Adolf D Berhane
*Assistant Examiner* — Afework S Demisse
(74) *Attorney, Agent, or Firm* — Mintz Levin Cohn Ferris Glovsky and Popeo, P.C.; Peter F. Corless

(57) ABSTRACT

A system for improving resolution of a voltage command of a low voltage DC-DC converter is provided. The system includes a voltage command signal generator that generates a first voltage command signal having a magnitude of a first specific range for a first voltage command of the low voltage DC-DC converter and a scale part that varies the first voltage command signal generated by the voltage command signal generator based on a preset scale ratio. An offset part sets a minimum value of a variable range of the first voltage command signal of the low voltage DC-DC converter. A resolution increasing part reduces the variable range of the first voltage command signal of the low voltage DC-DC converter by adding an output of the scale part and an output of the offset part.

14 Claims, 4 Drawing Sheets

SYSTEM AND METHOD FOR IMPROVING RESOLUTION OF VOLTAGE COMMAND OF LOW VOLTAGE DC-DC CONVERTER

CROSS REFERENCE TO RELATED APPLICATION

The present application claims priority to Korean Patent Application No. 10-2019-0046649, filed Apr. 22, 2019, the entire contents of which is incorporated herein for all purposes by this reference.

BACKGROUND

Field of the Invention

The present invention relates to a system and a method for improving resolution of a voltage command of a low voltage DC-DC converter, and more particularly, to a system and a method for improving resolution of a voltage command of a low voltage DC-DC converter by reducing a variable range of a voltage command signal of the low voltage DC-DC converter through a scale part and an offset part.

Description of the Related Art

To satisfy the enhanced regulation of exhaust gas for automobiles, development of eco-friendly vehicles including pure electric vehicles, hybrid vehicles, fuel cell vehicles, and the like is actively being developed. The eco-friendly vehicle is equipped with a high voltage battery, an auxiliary battery, a plurality of electric field loads, and a low voltage direct current-direct current (DC-DC) converter that converts high voltage input from the high voltage battery to a low voltage and supplies the low voltage to the auxiliary battery and the plurality of electric field loads. In other words, according to a demand of the battery and each electric field, the low voltage DC-DC converter may be configured to supply, by converting, high voltage input from the high voltage battery to the auxiliary battery and each electric field load.

Particularly, an output voltage command of the low voltage DC-DC converter is output from a microcomputer. However, the microcomputer is unable to output the DC signal and outputs only a pulse width modulation (PWM) signal. More specifically, a PWM signal output from the microcomputer becomes a signal of a DC voltage by being smoothed by a filter or the like, the signal of the DC voltage is applied to an analog integrated circuit (IC) or the like, and the analog IC may adjust an output of the low voltage DC-DC converter to correspond to the DC voltage by adjusting the switching of a semiconductor element in the low voltage DC-DC converter. Meanwhile, conventionally, to improve the response performance, a PWM switching frequency output from the microcomputer has been increased. However, when the PWM switching frequency output from the microcomputer is increased, the resolution is degraded, causing the ripple to be generated in the output current of the low voltage DC-DC converter.

The foregoing is intended merely to aid in the understanding of the background of the present invention, and is not intended to mean that the present invention falls within the purview of the related art that is already known to those skilled in the art.

SUMMARY

Accordingly, the present invention provides a system and a method for improving resolution of a voltage command of a low voltage DC-DC converter, in which the output current ripple of the low voltage DC-DC converter may be decreased by increasing the resolution of the voltage command of the low voltage DC-DC converter by reducing the variable range of the voltage command of the low voltage DC-DC converter through the scale part and the offset part.

According to one aspect of the present invention, a system for improving resolution of a voltage command of a low voltage DC-DC converter may include: a voltage command signal generator configured to generate a first voltage command signal having a magnitude of a first specific range for a first voltage command of the low voltage DC-DC converter; a scale part that varies the first voltage command signal generated at the voltage command signal generator based on a preset scale ratio; an offset part that sets a minimum value of a variable range of the first voltage command signal of the low voltage DC-DC converter; a resolution increasing part that reduces the variable range of the first voltage command signal of the low voltage DC-DC converter by adding an output of the scale part and an output of the offset part.

The system may further include: a smoothing part configured to convert, by smoothing, an output of the resolution increasing part into a signal of a DC voltage; and a controller configured to operate a semiconductor element in the low voltage DC-DC converter to adjust an output voltage of the low voltage DC-DC converter to correspond the DC voltage smoothed in the smoothing part. The scale part may reduce the first voltage command signal having the magnitude of the first specific range generated at the voltage command signal generator based on the preset scale ratio.

The scale ratio may be calculated based on a preset output range of a second voltage command and an output range of the first voltage command, of the low voltage DC-DC converter. The offset part may include a voltage supply unit configured to supply a constant voltage. The minimum value of the variable range of the first voltage command signal of the low voltage DC-DC converter set at the offset part may be calculated based on a constant voltage value supplied from the voltage supply unit, maximum and minimum voltage values within a preset variable range of an output voltage command of the low voltage DC-DC converter, and the variable range of a first output voltage command. The resolution of the voltage command signal increased at the resolution increasing part may be increased based on equation 1 below, Equation 1:
increased resolution of voltage command signal=resolution of first voltage command signal generated at voltage command signal generator X (1/scale ratio).

In the resolution increasing unit, a frequency of the first voltage command signal generated at the voltage command signal generator may be decreased based on equation 2 below, Equation 2:
decreased frequency of first voltage command signal=frequency of first voltage command signal generated at voltage command signal generator X scale ratio.

According to another aspect of the present invention, a method for improving resolution of a voltage command of a low voltage DC-DC converter may include: generating a first voltage command signal having a magnitude of a first specific range for a first voltage command of the low voltage DC-DC converter; varying the first voltage command signal generated at the voltage command signal generator based on a preset scale ratio at a scale part; setting a minimum value of a variable range of the first voltage command signal of the low voltage DC-DC converter; and reducing the variable range of the first voltage command signal of the low voltage DC-DC converter by adding an output of the scale part and an output of the offset part.

The method for improving resolution of a voltage command of a low voltage DC-DC converter may further include: converting, by smoothing, an output of the resolution increasing part into a signal of a DC voltage at the smoothing part; and operating a semiconductor element in the low voltage DC-DC converter to adjust an output voltage of the low voltage DC-DC converter to correspond the DC voltage. In the varying the first voltage command signal generated based on the preset scale ratio, the first voltage command signal having the magnitude of the first specified range may be reduced based on the preset scale ratio.

The scale ratio may be calculated based on a preset output range of a second voltage command and an output range of the first voltage command, of the low voltage DC-DC converter. In the setting the minimum value of the variable range of the first voltage command signal of the low voltage DC-DC converter, the minimum value of the variable range of the first voltage command signal of the low voltage DC-DC converter set at the offset part may be calculated based on a constant voltage value supplied from the voltage supply unit, maximum and minimum voltage values within a preset variable range of an output voltage command of the low voltage DC-DC converter, and the variable range of a first output voltage command.

In the increasing the resolution of the voltage command signal of the low voltage DC-DC converter, the increased resolution of the voltage command signal may be increased based on equation 1 below, Equation 1 increased resolution of voltage command signal=resolution of first voltage command signal generated at voltage command signal generator X (1/scale ratio).

According to the present invention, the output current ripple of the low voltage DC-DC converter may be decreased by increasing the resolution of the voltage command of the low voltage DC-DC converter by reducing the variable range of the voltage command of the low voltage DC-DC converter. In addition, by decreasing the output current ripple of the low voltage DC-DC converter, it may be possible to improve the durability performance against deterioration or the like of the low voltage battery.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1:
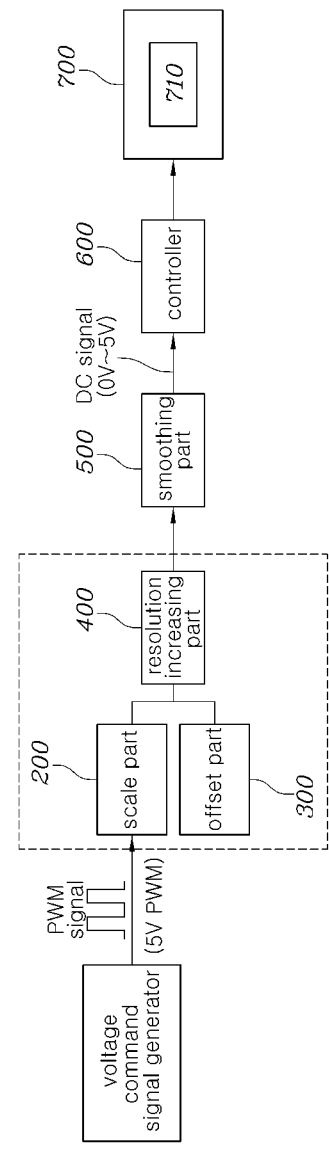
FIG. 1 is a block diagram illustrating a configuration of a system for improving resolution of a voltage command of a low voltage DC-DC converter according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinbelow, a system and a method for improving resolution of a voltage command of a low voltage DC-DC converter according to an exemplary embodiment of the present invention will be described in detail with reference to the accompanying drawings. Throughout the drawings, the same reference numerals will refer to the same or like parts.

As illustrated in FIG. 1, the system for improving resolution of the voltage command of the low voltage DC-DC converter according to the exemplary embodiment of the present invention may include a voltage command signal generator 100, a scale part 200, an offset part 300, and a resolution increasing part 400 and may further include a smoothing part 500, a controller 600, and a low voltage DC-DC converter 700 having a semiconductor element 710. The various components of the system may be operated by a controller having a processor and a memory.

Figure 3:
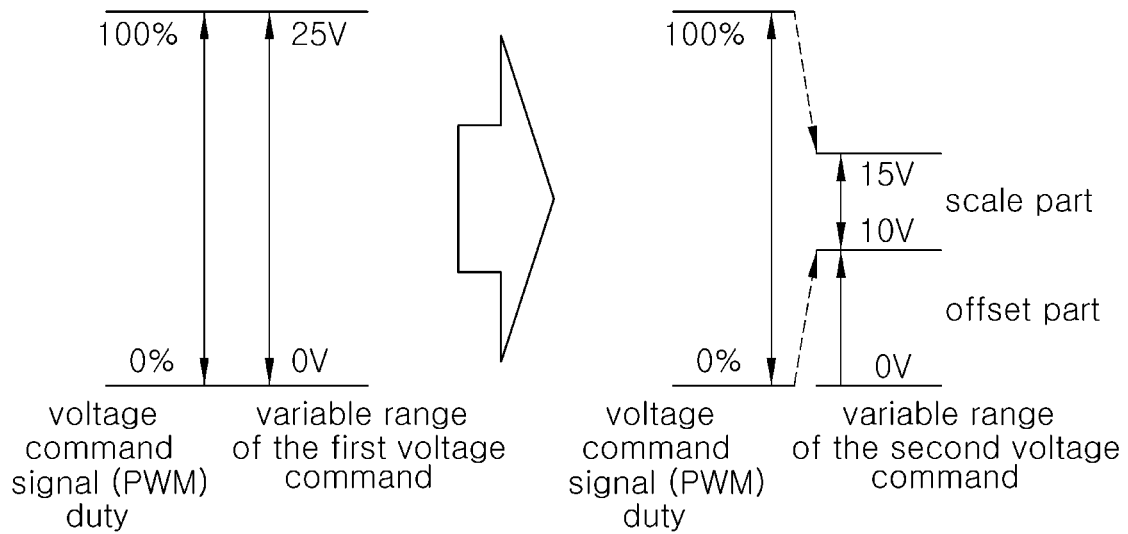
FIG. 3 is a view illustrating reducing a variable range of the voltage command of the low voltage DC-DC converter in the system for improving resolution of the voltage command of the low voltage DC-DC converter according to the exemplary embodiment of the present invention.

Particularly, the voltage command signal generator 100 may be configured to generate a first voltage command signal having a magnitude of a first specific range for a first voltage command of the low voltage DC-DC converter 700, and, the voltage command signal generator 100 may be a microcomputer. More specifically, the first voltage command of the low voltage DC-DC converter 700 may be about 0 to 25 V as shown in FIG. 3, and the first voltage command signal may be a PWM signal having a magnitude ranging from about 0 to 5 V as shown in FIG. 1. In other words, the voltage command signal generator 100 may be configured to generate the PWM signal having the magnitude of about 0 to 5 V for the first voltage command having the variable range of about 0 to 25 V of the low voltage DC-DC converter 700.

The voltage command signal generator 100 may be configured to generate the first voltage command signal of the magnitude of about 5 V by setting the duty of the PWM to about 100% for the first voltage command of about 25 V. In addition, the voltage command signal generator 100 may be configured to generate a first voltage command signal having a magnitude of about 2.5 V by setting the PWM duty to about 50% for the first voltage command of about 12.5 V. In the same manner, the voltage command signal generator 100 may be configured to generate a first voltage command signal of about 0 to 5 V by varying the duty of the PWM from about 0 to 100% for the first voltage command having a variable range of about 0 to 25 V.

Figure 2:
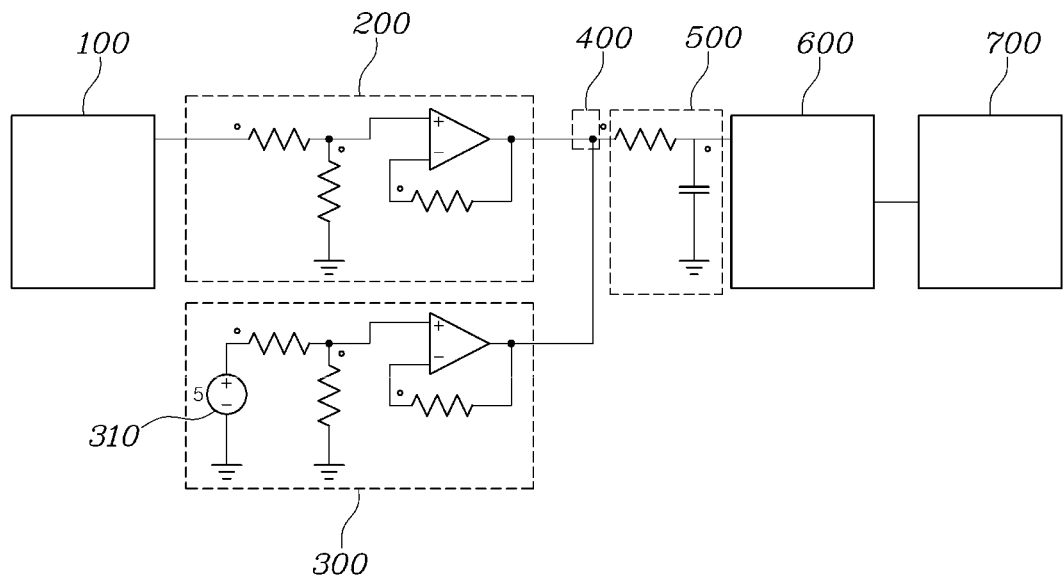
FIG. 2 is a view illustrating detailed circuits of a scale part, an offset part, and a smoothing part in the system for improving resolution of the voltage command of the low voltage DC-DC converter according to the exemplary embodiment of the present invention.

In addition, the scale part 200 may be configured to vary the first voltage command signal generated by the voltage command signal generator 100 based on a preset scale ratio. With reference to FIG. 2, the scale part 200 may include a comparator and a plurality of resistors. In particular, an output of the voltage command signal generator 100 may be input to the positive terminal of the comparator, and an output of the comparator may be input to the negative terminal of the comparator. In addition, a resistor may be respectively disposed between the positive terminals of the voltage command signal generator 100 and the comparator and between the output of the comparator and the negative terminal of the comparator.

The scale part 200 having the above-described configuration may be configured to reduce the first voltage command signal having the magnitude of the first specific range generated by the voltage command signal generator 100 based on the preset scale ratio. The scale ratio may be calculated based on a preset output range of a second voltage command and an output range of the first voltage command, of the low voltage DC-DC converter 700. According to the exemplary embodiment, when the preset output range of the second voltage command and the output range of the first voltage command of the low voltage DC-DC converter are about 10 to 15 V and about 0 to 25 V, respectively, the scale ratio may be calculated as about 1/5 according to the equation below. However, the scale ratio of 1/5 is according to one exemplary embodiment and may become different according to the preset output range of the voltage command of the low voltage DC-DC converter 100.

Equation

Scale ratio=(maximum value of preset variable range of second voltage command−minimum value of preset output range of second voltage command)/(maximum value of variable range of first voltage command−minimum value of variable range of first voltage command).

The offset part 300 may be configured to set a minimum value of a variable range of the first voltage command signal of the low voltage DC-DC converter 700. With reference to FIG. 2, the offset part 300 may include a voltage supply unit 310 configured to supply a constant voltage, a comparator, and a plurality of resistors. The voltage supplied from the voltage supply unit 310 may be input to the positive terminal of the comparator, and the output of the comparator may be input to the negative terminal of the comparator. In addition, a resistor may be respectively disposed between the voltage supply unit 310 and the positive terminal of the comparator and between the output of the comparator and the negative terminal of the comparator.

More specifically, a minimum value of the variable range of the first voltage command signal of the low voltage DC-DC converter 700 set by the offset part 300 may be calculated based on a constant voltage value supplied from the voltage supply unit 310, maximum and minimum voltage values within a preset variable range of an output voltage command of the low voltage DC-DC converter 700, and the variable range of the first output voltage command. For the convenience of description, when it is assumed that the constant voltage supplied from the voltage supply unit 310 is about 5 V, the preset variable range of the second voltage command of the low voltage DC-DC converter is about 10 to 15 V, and the variable range of the first voltage command is about 0 to 25 V, the minimum value of the variable range of the first voltage command signal of the low voltage DC-DC converter 700 may be calculated as about 1 V according to the following equation:

Equation

Minimum value of variable range of first voltage command signal=voltage value supplied from voltage supply unit X (maximum value of preset variable range of second voltage command−minimum value of preset output range of second voltage command)/(maximum value of variable range of first voltage command−minimum value of variable range of first voltage command).

The resolution increasing part 400 may be configured to increase the resolution of a voltage command signal of the low voltage DC-DC converter by reducing the variable range of the first voltage command signal of the low voltage DC-DC converter by adding an output of the scale part and an output of the offset part.

Hereinafter, for the convenience of description, the characteristics of the resolution increasing part 400 will be described based on the description of the above-described voltage command signal generator 100, the scale part 200, and the offset part 300 and the exemplary embodiment. More specifically, by adding an output of the scale part 200, which the first voltage command signal of 0 to 5 V is varied in accordance with a preset scale ratio, for example, 1/5, and the minimum value, for example, about 2 V, of the variable range of the first voltage command signal set by the offset part 300, the first voltage command signal having a variable range of about 0 to 5 V may be reduced to a voltage command signal having a variable range of about 2 to 3 V, whereby the resolution increasing part 400 may be configured to increase the resolution of the voltage command signal of the low voltage DC-DC converter. In particular, varying the first voltage command signal having a variable range of about 0 to 5 V to a voltage command signal having a variable range of about 2 to 3 V may indicate that the first voltage command having a variable range of about 0 to 25

V is varied to a voltage command having a variable range of about 10 to 15V through the scale part 200, the offset part 300, and the resolution increasing part 400, as shown in FIG. 3.

Meanwhile, the resolution of the voltage command signal increased at the resolution increasing part 400 may be increased based on equation 1 below. For example, when the preset scale ratio is 1/5, the resolution of the voltage command signal may be increased by five times.

Equation 1

Increased resolution of voltage command signal=resolution of first voltage command signal generated at voltage command signal generator X (1/scale ratio).

In addition, in the resolution increasing unit 400, a frequency of the first voltage command signal generated at the voltage command signal generator 100 may be decreased based on equation 2 below. For example, when the preset scale ratio is 1/5, the frequency of the first voltage command signal generated at the voltage command signal generation unit 100 may be decreased by 1/5 times.

Equation 2

Decreased frequency of first voltage command signal=frequency of first voltage command signal generated at voltage command signal generator X scale ratio.

The smoothing part 500 may be configured to convert, by smoothing, an output of the resolution increasing part 400 into the signal of the DC voltage. According to an exemplary embodiment, as shown in FIG. 2, the smoothing unit 500 may be an RC filter including a resistor and a capacitor. The controller 600 may be configured to operate the semiconductor element 710 in the low voltage DC-DC converter 700 to adjust an output voltage of the low voltage DC-DC converter to correspond the DC voltage smoothed in the smoothing part 500. For example, the controller 600 may include a voltage controller, and may further include a current controller and a semiconductor element control signal generator configured to generate a signal controlling switching of the semiconductor element 710.

Figure 4:
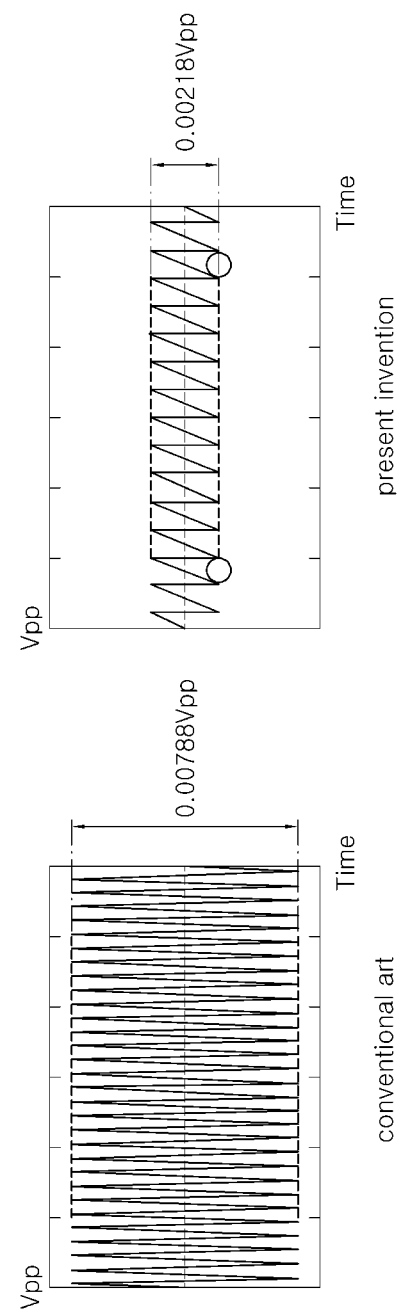
FIG. 4 is a view illustrating a comparison of a current ripple of the low voltage DC-DC converter reduced through the system for improving resolution of the voltage command of the low voltage DC-DC converter according to the exemplary embodiment of the present invention with a current ripple of a conventional art.

According to the above-described system increasing the resolution of the voltage command of the low voltage DC-DC converter according to the present invention, the variable range of the voltage command of the low voltage DC-DC converter may be reduced using the scale part and the offset part, thereby increasing the resolution of the voltage command of the low voltage DC-DC converter. Accordingly, the output current ripple of the low voltage DC-DC converter may be decreased as shown in FIG. 4. In addition, by decreasing the output current ripple of the low voltage DC-DC converter, it may be possible to improve the durability performance against deterioration and the like of the low voltage battery.

Figure 5:
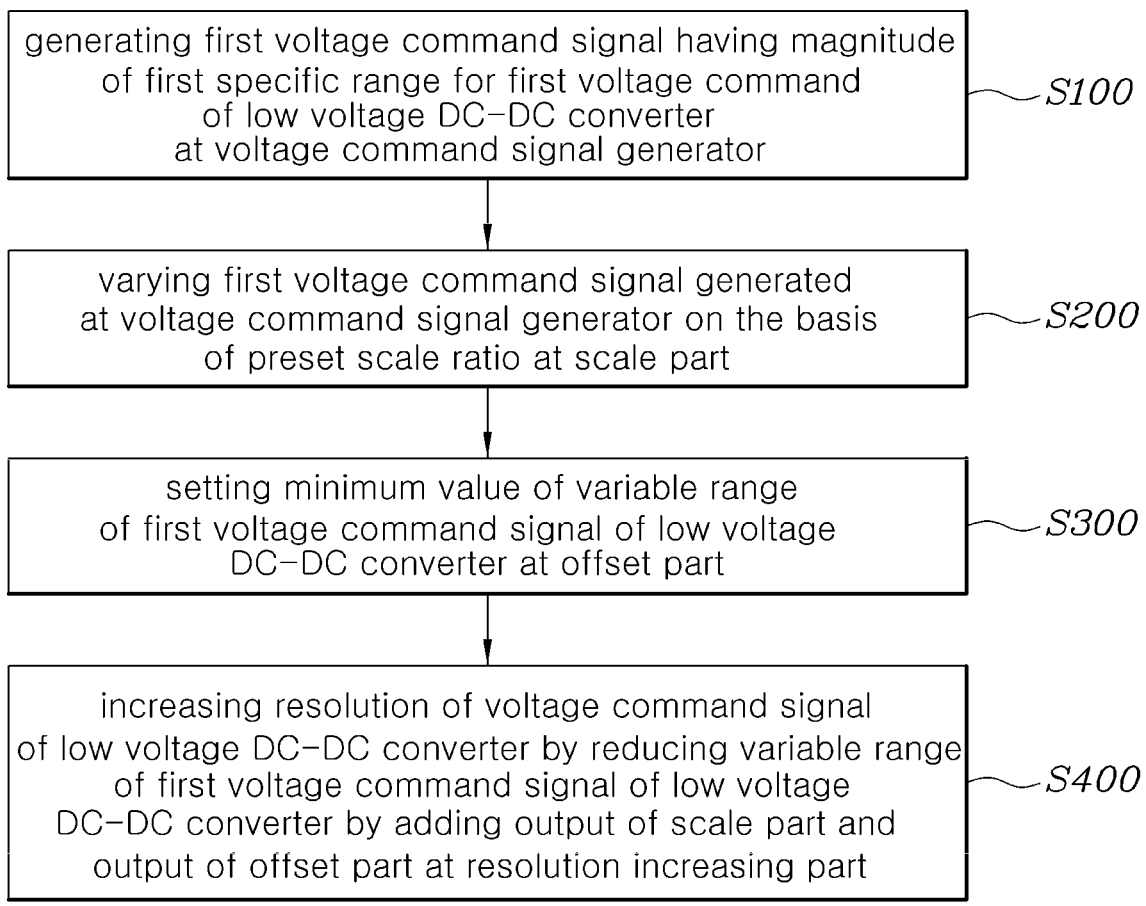
FIG. 5 is a flowchart illustrating a method for improving resolution of the voltage command of the low voltage DC-DC converter according to the exemplary embodiment of the present invention.

FIG. 5 is a flowchart illustrating a method for improving resolution of the voltage command of the low voltage DC-DC converter according to the exemplary embodiment of the present invention. The method described herein below may be executed by a controller. As shown in FIG. 5, the method for improving resolution of the voltage command of the low voltage DC-DC converter according to the exemplary embodiment of the present invention may include: generating, by a voltage command signal generator, a first voltage command signal having a magnitude of a first specific range for a first voltage command of the low voltage DC-DC converter; varying, by a scale part, the first generated voltage command signal generated based on a preset scale ratio; setting, by an offset part, a minimum value of a variable range of the first voltage command signal of the low voltage DC-DC converter; and increasing, by a resolution increasing part, the resolution of a voltage command signal of the low voltage DC-DC converter by reducing the variable range of the first voltage command signal of the low voltage DC-DC converter by adding an output of the scale part and an output of the offset part.

In addition, the method for improving resolution of the voltage command of the low voltage DC-DC converter may include: converting, by a smoothing part, an output of the resolution increasing part into a signal of a DC voltage; and operating, by the controller, a semiconductor element in the low voltage DC-DC converter to adjust an output voltage of the low voltage DC-DC converter to correspond to the DC voltage.

More specifically, in the varying the first voltage command signal generated at the voltage command signal generator based on the preset scale ratio at the scale part, the first voltage command signal having the magnitude of the first specified range is reduced based on the preset scale ratio. The scale ratio may be calculated based on the output range of the second voltage command and the output range of the first voltage command of the preset low voltage DC-DC converter.

In addition, in the setting the minimum value of the variable range of the first voltage command signal of the low voltage DC-DC converter, the minimum value of the variable range of the first voltage command signal of the low voltage DC-DC converter may be calculated based on a constant voltage value supplied from the voltage supply unit, maximum and minimum voltage values within a preset variable range of an output voltage command of the low voltage DC-DC converter, and the variable range of a first output voltage command.

The resolution of the voltage command signal of the low voltage DC-DC converter may be increased based on equation 1.

Equation 1

Increased resolution of voltage command signal=resolution of first voltage command signal generated at voltage command signal generator X (1/scale ratio).

Meanwhile, the detailed technical features of each step in the method for improving resolution of the voltage command of the low voltage DC-DC converter according to the exemplary embodiment of the present invention are the same as the technical features in the system for improving resolution of the voltage command of the low voltage DC-DC converter described above, and thus a detailed description thereof will be omitted.

Although the invention is described with reference to specific items such as specific structural elements, to merely some exemplary embodiments, and to drawings, such specific details disclosed herein are merely representative for purposes of helping more comprehensive understanding of the present invention. The present invention, however, is not limited to only the exemplary embodiments set forth herein, and those skilled in the art will appreciate that the present invention can be embodied in many alternate forms.

What is claimed is:

1. A system for improving resolution of a voltage command of a low voltage direct current-direct current (DC-DC) converter, comprising:
    a voltage command signal generator configured to generate a first voltage command signal having a magnitude of a first specific range for a first voltage command of the low voltage DC-DC converter;
    a scale part configured to vary the first voltage command signal generated by the voltage command signal generator based on a preset scale ratio;

an offset part configured to set a minimum value of a variable range of the first voltage command signal of the low voltage DC-DC converter;

a resolution increasing part configured to reduce the variable range of the first voltage command signal of the low voltage DC-DC converter by adding an output of the scale part and an output of the offset part.

2. The system of claim 1, further comprising:

a smoothing part configured to convert, by smoothing, an output of the resolution increasing part into a signal of a DC voltage; and a controller configured to operate a semiconductor element in the low voltage DC-DC converter to adjust an output voltage of the low voltage DC-DC converter to correspond to the DC voltage smoothed in the smoothing part.

3. The system of claim 1, wherein the scale part is configured to reduce the first voltage command signal having the magnitude of the first specific range generated at the voltage command signal generator based on the preset scale ratio.

4. The system of claim 1, wherein the scale ratio is calculated based on a preset output range of a second voltage command and an output range of the first voltage command, of the low voltage DC-DC converter.

5. The system of claim 1, wherein the offset part includes a voltage supply unit configured to supply a constant voltage.

6. The system of claim 1, wherein the minimum value of the variable range of the first voltage command signal of the low voltage DC-DC converter set by the offset part is calculated based on a constant voltage value supplied from the voltage supply unit, maximum and minimum voltage values within a preset variable range of an output voltage command of the low voltage DC-DC converter, and the variable range of a first output voltage command.

7. The system of claim 1, wherein the resolution of the voltage command signal increased at the resolution increasing part is increased based on:

increased resolution of voltage command signal=resolution of first voltage command signal generated at voltage command signal generator X (1/scale ratio).

8. The system of claim 1, wherein, in the resolution increasing unit, a frequency of the first voltage command signal generated at the voltage command signal generator is decreased based:

decreased frequency of first voltage command signal=frequency of first voltage command signal generated at voltage command signal generator X scale ratio.

9. A method for improving resolution of a voltage command of a low voltage direct current-direct current (DC-DC) converter, comprising:

generating, by a voltage command signal generator, a first voltage command signal having a magnitude of a first specific range for a first voltage command of the low voltage DC-DC converter;

varying, by a scale part, the first voltage command signal generated by the voltage command signal generator based on a preset scale ratio;

setting, by an offset part, a minimum value of a variable range of the first voltage command signal of the low voltage DC-DC converter; and reducing, by a resolution increasing part, the variable range of the first voltage command signal of the low voltage DC-DC converter by adding an output of the scale part and an output of the offset part, wherein the voltage command signal generator, the scale part, the offset part, and the resolution increasing part are components of a controller.

10. The method of claim 9, further comprising:

converting, by a smoothing part, an output of the resolution increasing part into a signal of a DC voltage; and operating, by the controller, a semiconductor element in the low voltage DC-DC converter to adjust an output voltage of the low voltage DC-DC converter to correspond to the DC voltage.

11. The method of claim 9, wherein, in the varying the first voltage command signal generated by the voltage command signal generator based on the preset scale ratio at the scale part, the first voltage command signal having the magnitude of the first specified range is reduced based on the preset scale ratio.

12. The method of claim 9, wherein the scale ratio is calculated based on a preset output range of a second voltage command and an output range of the first voltage command, of the low voltage DC-DC converter.

13. The method of claim 9, wherein, in the setting the minimum value of the variable range of the first voltage command signal of the low voltage DC-DC converter by the offset part, the minimum value of the variable range of the first voltage command signal of the low voltage DC-DC converter set by the offset part is calculated based on a constant voltage value supplied from the voltage supply unit, maximum and minimum voltage values within a preset variable range of an output voltage command of the low voltage DC-DC converter, and the variable range of a first output voltage command.

14. The method of claim 9, wherein the resolution of the voltage command signal of the low voltage DC-DC converter is increased based on:

increased resolution of voltage command signal=resolution of first voltage command signal generated at voltage command signal generator X (1/scale ratio).

* * * * *